(12) United States Patent
Rebeyrotte et al.

(10) Patent No.: US 8,741,012 B2
(45) Date of Patent: Jun. 3, 2014

(54) AVIONIC BAY COMPRISING A DEVICE FOR FILTERING COOLING AIR FOR ELECTRICAL EQUIPMENT INSTALLED IN SUCH A BAY AND AIRCRAFT EQUIPPED WITH SUCH A BAY

(75) Inventors: Vincent Rebeyrotte, Colomiers (FR); Jean-Christophe Caron, Leguevin (FR)

(73) Assignee: Airbus Operations SAS, Toulouse (FR)

( * ) Notice: Subject to any disclaimer, the term of this patent is extended or adjusted under 35 U.S.C. 154(b) by 43 days.

(21) Appl. No.: 13/469,463

(22) Filed: May 11, 2012

(65) Prior Publication Data

US 2012/0285132 A1    Nov. 15, 2012

(30) Foreign Application Priority Data

May 13, 2011   (FR) ..................... 11 01468

(51) Int. Cl.
    *B01D 46/00* (2006.01)
(52) U.S. Cl.
    USPC ............. 55/385.4; 55/385.6; 55/445; 55/446; 361/695
(58) Field of Classification Search
    USPC ............. 55/385.4, 385.6, 480, 493, 501, 502, 55/503, 504, 505, 516, 517, 385.7; 454/184, 192, 76, 141, 158; 361/695
    See application file for complete search history.

(56) References Cited

U.S. PATENT DOCUMENTS

| 3,853,475 A | | 12/1974 | Gordon et al. | |
| 5,298,045 A | * | 3/1994 | Whitson et al. | 55/385.6 |
| 5,464,461 A | * | 11/1995 | Whitson et al. | 55/480 |
| 5,725,622 A | * | 3/1998 | Whitson et al. | 55/385.4 |

FOREIGN PATENT DOCUMENTS

FR          2 139 075          1/1973

OTHER PUBLICATIONS

French Preliminary Search Report issued Nov. 8, 2011, in French 1101468, filed May 13, 2011 (with English Translation of Categories of Cited Documents).

* cited by examiner

*Primary Examiner* — Duane Smith
*Assistant Examiner* — Minh-Chau Pham
(74) *Attorney, Agent, or Firm* — Oblon, Spivak, McClelland, Maier & Neustadt, L.L.P.

(57) ABSTRACT

An avionic bay with a device for filtering cooling air for aircraft electrical equipment. The device includes at least two filtration grilles provided with apertures and which are disposed successively one behind the other in order to filter the air drawn from a cooling air vein before distributing it to an aircraft electrical equipment item. The apertures of the second grille are offset transversely in relation to the apertures of the first grille.

12 Claims, 5 Drawing Sheets

AVIONIC BAY COMPRISING A DEVICE FOR FILTERING COOLING AIR FOR ELECTRICAL EQUIPMENT INSTALLED IN SUCH A BAY AND AIRCRAFT EQUIPPED WITH SUCH A BAY

BACKGROUND

This invention relates to an avionic bay comprising a device for filtering cooling air for aircraft electrical equipment which is installed in such a bay. It also relates to an aircraft equipped with such a bay.

There are known in the state of the art electrical equipment items made up of several electronic boards, generally printed circuits on which heat-dissipating electronic components are installed and soldered. Furthermore, electrical connectors are disposed at least on the edges of the boards and the electronic boards as a whole are inserted into a metal housing or packaging. The housing or packaging consists mainly of a base and a cover. The electrical equipment set up in this way is intended to be installed on a rack of an avionic bay. Avionic bays are disposed in a pressurized zone of the aircraft, under a partially controlled ambient temperature. These avionic bays provide the electrical equipment items with preferential ventilation conditions thus allowing cooling thereof.

DESCRIPTION OF THE RELATED ART

In order to integrate the electrical equipment items into the avionic bay, there is used, for example, a technique described in the document U.S. Pat. No. 5,253,484. An avionic bay comprises several racks and each rack integrates a ventilation vein. On each rack, and for each electrical equipment item intended for same, there is installed a mechanical and electrical interface, called tray, which performs several functions.

Among these functions, the tray provides aeraulic control of the part of the rack above the ventilation vein in which the ventilation air allotted to the electrical equipment items circulates. The cooling air intended for an electrical equipment item is drawn by the tray from the cooling air vein of the rack of the bay. The cooling air is used to draw off thermal power dissipated by the electronic components of the boards of the associated electrical equipment. This dissipated thermal power is evacuated through convection by virtue of the cooling air that goes through the spaces between the boards before leaving the equipment via holes provided through the housing of the electrical equipment, then being drawn out of the avionic bay via an extraction shaft situated above electrical equipment 2.

Such an arrangement is defined in particular in an international aeronautical standard ARINC600 and an exemplary implementation is described in the document US-A-20040050569.

A schematic side view in cross section and a partial view in perspective of an electrical equipment item installed on a tray of a rack have been shown respectively on FIGS. 1a and 1b.

Rack 1 comprises mainly a bent metal section taking on the shape of a channel bordered by two vertical edges and two side (horizontal) wings intended to bear electrical equipment items such as equipment 2 later on.

A tray 9, serving as mechanical and electrical interface, shown in perspective on FIG. 1b, is positioned on the side wings of rack 1. Tray 9 has a vertical part 6, forming a back, connected by an angle bracket 6a and an angle bracket 6b to a horizontal part 7 (FIG. 1b) forming a seat.

The tray is fastened, for example by screws, onto the side wings of rack 1 and is constructed so as to accommodate an electrical equipment item 2. The electrical equipment comprises mainly a housing formed by a metal cover which is closed off at the bottom part by a base bearing a slider support. On each of the sliders of the slider support, a removable electronic board such as board 10 on FIG. 1a is inserted.

Electronic board 10 comprises a printed circuit on which there are installed a multitude of electronic components arranged in rows 11A, 11B and 11C. A connector 4 makes it possible to connect all the electronic boards of the equipment with an avionic connector not shown on FIG. 1a. The connection is implemented during installation of electrical equipment 2 on tray 9, and during its insertion into an avionic connector 8 (FIG. 1b) which is connected to the electrical network of the airplane.

As shown on FIG. 1b, seat 7 of tray 9 has, above the channel formed in rack 1 and serving as housing for circulation of a cooling air vein 14, a hollow part 12 which is provided with a plurality of holes such as hole 13. This part constitutes a zone for passage of the air between the ventilation vein and the electrical equipment.

As is known in the state of the art and according to the power dissipated by the electrical equipment, certain holes 13 of seat 7 may be blocked and others may be open so that the pressure drop between air vein 14 and the flow of cooling air injected into the equipment may be controlled.

For this purpose, the bottom part of electrical equipment 2 is provided with slots along the inter-slider spaces. It results from this arrangement that the cold air is drawn from vein 14 and circulates vertically on FIG. 1a along the electronic components of the boards that produce heat during their operation. The top part 15 of the housing for the electrical equipment likewise is provided with holes to allow evacuation of the cooling air after its passage over the components to be cooled.

It will be noted, however, that it would be advantageous to be able to filter the cooling air effectively before it reaches the electrical equipment, in particular the electronic boards, to be cooled.

BRIEF SUMMARY

To this end, this invention relates to an avionic bay comprising at least one aircraft electronic equipment item, the bay comprising a device for filtering cooling air intended to cool the said at least one electrical equipment item, characterized in that the device comprises:
  means for conveying a cooling air vein intended to be distributed at least in part to an aircraft electrical equipment item,
  a first grille for filtering at least one part of the cooling air vein, the first grille including apertures that go right through the grille along an axial direction,
  a second grille for filtering the said at least one part of the air vein filtered beforehand, the second grill including apertures that are offset transversely in relation to the apertures of the first grille,
  means for distributing at least in part to the aircraft electrical equipment the said at least one part of the air vein filtered by the last grille.

Such a filtration device is particularly simple in design and proves to be effective in filtering the air, prior to the supplying of this air to an aircraft electrical equipment item.

Each filtration grille includes a series of apertures that go right through the grille (in its thickness) along an axial direction that is taken on by the cooling air to pass through the grille concerned.

It will be noted that the two (or three) grilles are disposed successively one behind the other.

The fact that the apertures of the second grille are offset transversely in relation to the apertures of the first grill and not opposite the latter forms baffles for the cooling air going through these two grilles, which becomes the air flow, thus contributing to the filtration effect.

It will be noted, for example, that the apertures are disposed in offset rows from one grille to the other.

Furthermore, the diameters of the apertures are not necessarily different from one grille to the other, but of course may vary according to filtration needs and pressure-drop constraints.

The filtration according to the invention thus is particularly simple to use and effective.

In this way, the air drawn from the cooling vein and which is distributed to the electrical equipment or to the electrical equipment items is filtered particularly effectively, which tends to reduce the proportion of dirt and dust inside the equipment or equipment items.

It will be noted that the width (or diameter) of the apertures of the second grille may be less than that of the apertures of the first grille.

The number of apertures may vary from one grille to the other and, for example, be greater in the second grille, the width of the apertures also being able to vary or not vary from one grille to the other as indicated above.

According to a possible characteristic, the passage of the cooling air through the filtration grilles is carried out along the axial direction.

In this way, the air circulating through the grilles goes through same axially but its path is diverted laterally between the two grilles. The two grilles therefore are parallel to one another.

It will be noted that the device briefly explained above is adapted for filtering cooling air for one or more aircraft electrical equipment items.

For example, air is drawn from the cooling air vein to pass through a filtration device according to the invention before being distributed to an electrical equipment item, while air is drawn slightly farther off on the path of the cooling air vein so as to be injected into another filtration device according to the invention before being distributed to another electrical equipment item.

It also will be noted that the same filtration device may be adapted for filtering the air upstream from several aircraft electrical equipment items.

According to a possible characteristic, the filtration grilles are disposed parallel so that the passage of the air through each of the two grilles takes place along the axial direction.

According to another possible characteristic, the two grilles are spaced apart from one another and the space between the grilles around the zone of the grilles including filtration apertures is closed off with regard to the outside.

This space is, for example, closed off by virtue of a joint, for example of peripheral form, disposed in contact with the two grilles opposite one another.

According to another possible characteristic, the device comprises a third grille for filtering the said at least one part of the air vein filtered by the second filtration grille.

In this way, the filtered air originating from the second grille enters the apertures of the third filtration grille so as to improve the filtration effect.

According to another possible characteristic, the third filtration grille includes filtration apertures that are offset transversely in relation to the apertures of the second filtration grille, so as to form baffles for the air.

The proposed effect between the first and second filtration grilles because of the offset of the apertures from one grille to the other also is found again here between the second and third filtration grilles.

This additional baffle level improves the filtration effect on the cooling air.

It will be noted, for example, that the passage of the air through the third grille also is carried out along the axial direction.

It will be noted that the axial direction of passage through the grilles by the air is the direction along which the air, once filtered, passes along the electronic boards and their components to be cooled.

It will be noted that the transverse offset of the apertures between two consecutive plates or grilles (between the first and second grilles and/or between the second and third grilles) may be adjusted in amplitude according to filtration needs, while taking pressure-drop constraints into account.

It should be noted that the third grille may extend along a dimension that is larger than that of the second grille so as to adapt to the largest dimension of the electrical equipment (e.g.: dimension including or corresponding to the longitudinal dimension or length of the electronic boards).

According to a possible characteristic, the avionic bay comprises an electrical and mechanical adaptation tray, the first filtration grille forming part of the said tray and the said at least one electrical equipment item being installed on the said tray.

For example, the first filtration grille is formed in the seat of the tray.

According to another possible characteristic, the said at least one electrical equipment item is installed on the electrical and mechanical adaptation tray through a base of which the second filtration grille forms part.

For example, the base itself has cut-outs so as to constitute the second filtering grille.

According to another possible characteristic, the tray is installed on a rack of the avionic bay integrating the cooling air vein.

In general, filtration of the cooling air is carried out in order to eliminate polluting particles at least in part from this air.

The invention also relates to an aircraft, characterized in that it incorporates at least an avionic bay in accordance with the brief explanation above (with or without the possible additional characteristics) and able to accommodate at least one electrical equipment item according to the invention.

BRIEF DESCRIPTION OF THE DRAWINGS

Other characteristics and advantages of this invention will be better understood with the aid of the attached description and the Figures on which.

DETAILED DESCRIPTION

Figure 1A:
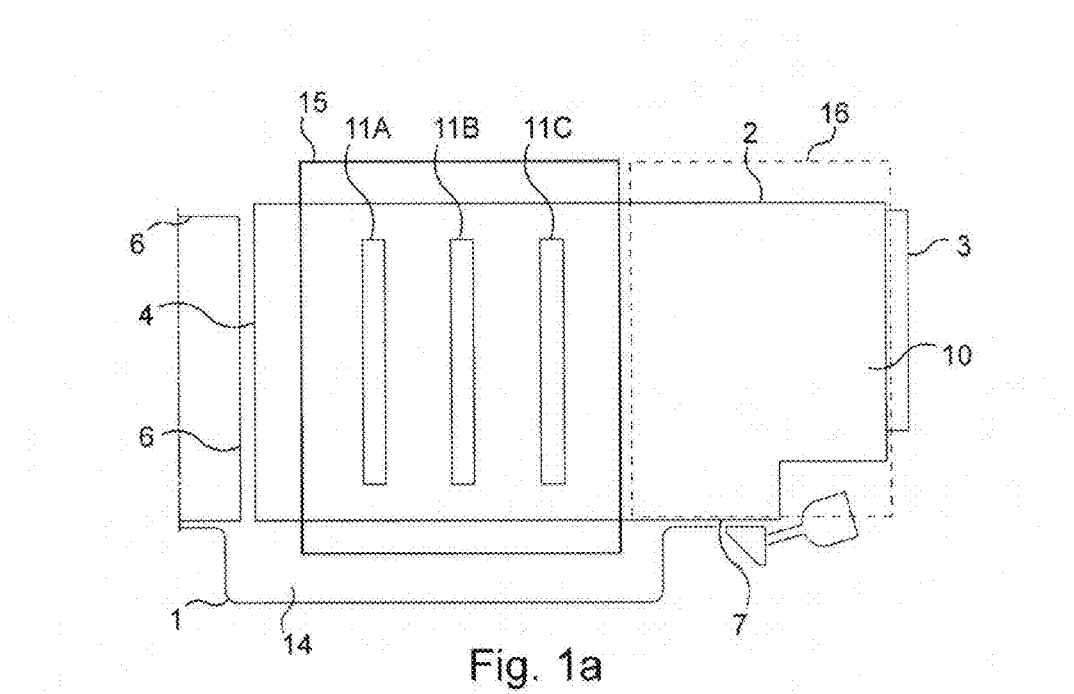
FIGS. 1a and 1b show views of the state of the art described above.
Figure 1B:
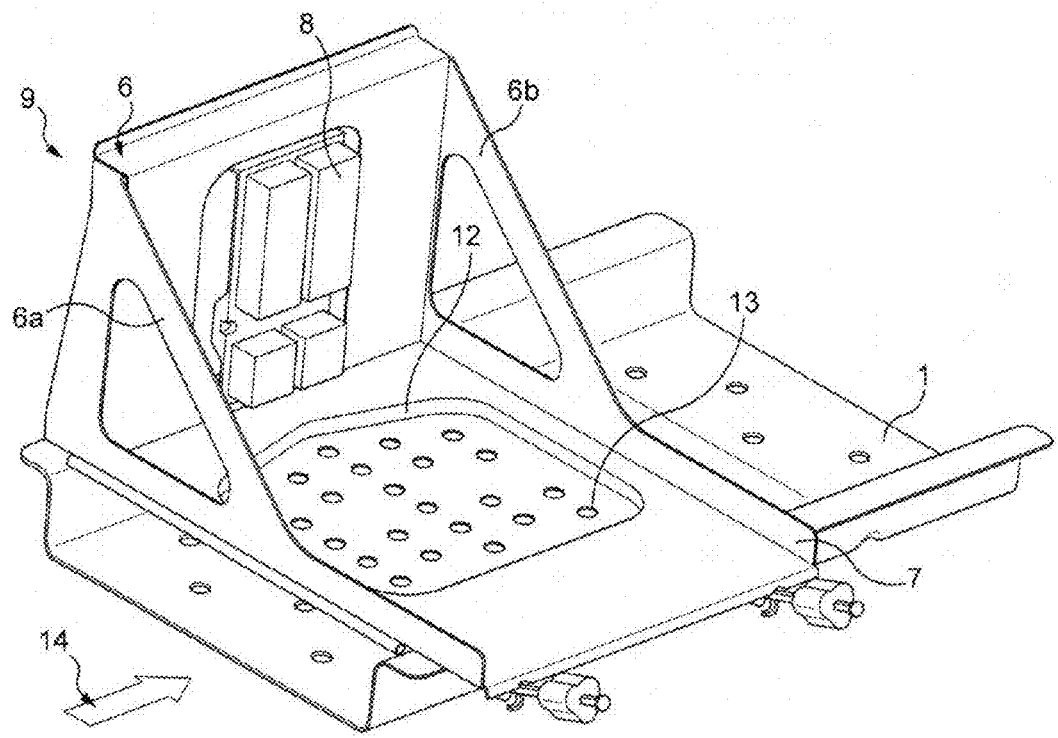
Figure 2:
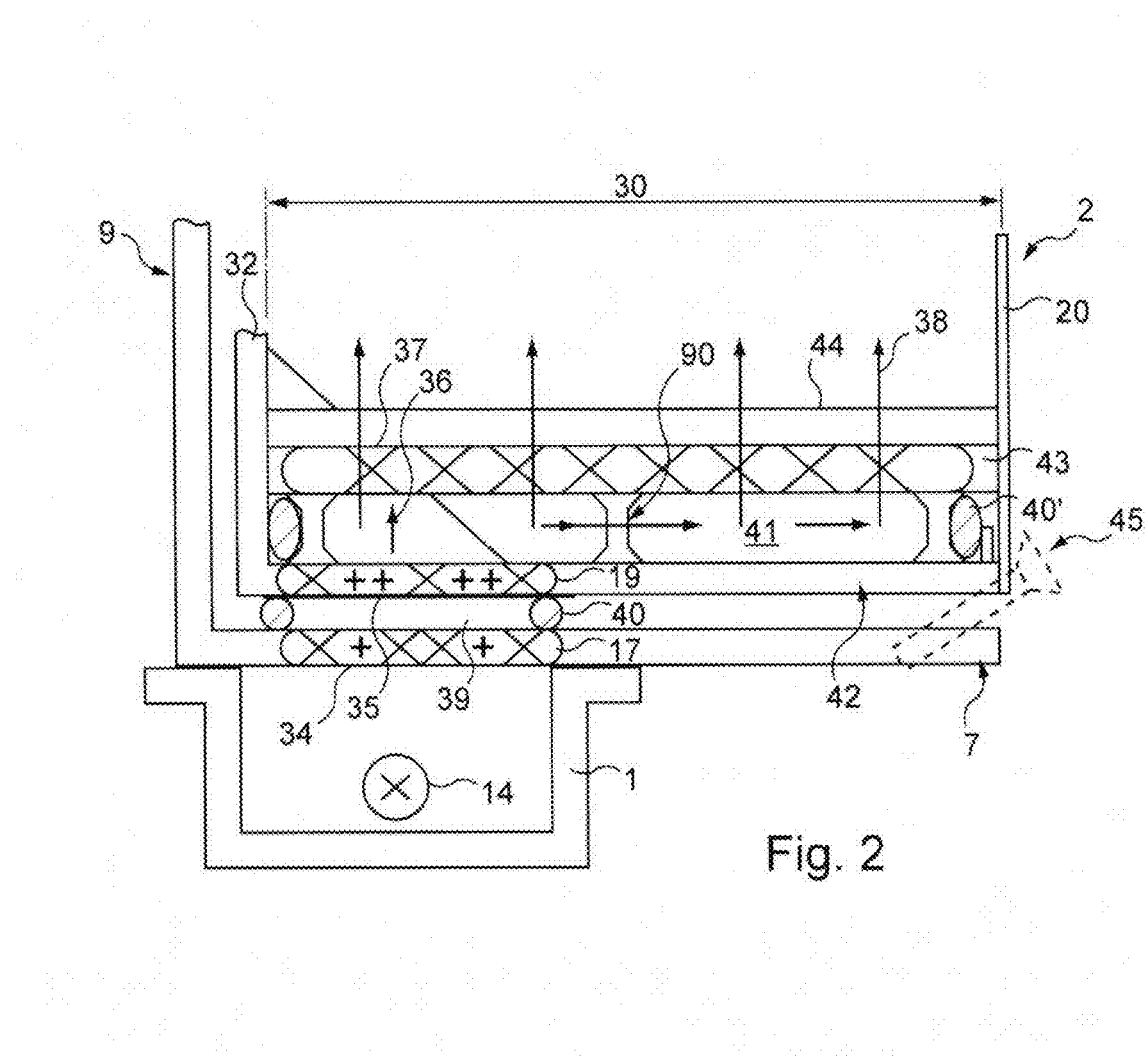
FIG. 2 shows a functional diagram of a device according to the invention.

FIG. 2 shows a cross section of a rack 1 of an avionic bay carried on board an aircraft. As shown, a first pressure zone or chamber 39 is formed and is delimited by a joint 40. This joint is disposed between seat 7 of mechanical and electrical adaptation tray 9 and base 42 of the housing of electrical equipment 2 to be cooled. This first pressure zone or chamber 39 does not continue, to the right of the drawing, to the front zone of electrical equipment 2, but on the contrary remains confined in the left part of the drawing near back 6 of the tray. The arrangement of a second pressure zone allows cooling of the entire volume 30 of the interior of electrical equipment 2.

In this way a second pressure chamber 41 is created between the upper face of base 42 of the electrical equipment and the lower face of slider support 43 by the interposition of a second aeraulic joint 40'. As will be explained in detail below, slider support 43 is equipped with inter-slider zones provided with porosities or apertures 37 the diameter or diameters and the distribution of which are determined according to a predetermined pressure drop. In order to create the second pressure zone, slider support 43 is moved away from the upper face of lower base 42 by crosspieces such as crosspiece 90. During installation of slider support 43 on the upper face of base 42, second joint 40' is squeezed and imperviousness of the second pressure zone thus is ensured. First joint 40 is tightened between seat 7 of tray 9 and the lower face of base 42 during insertion of electrical equipment 2 onto tray 9, by tightening of oblique nuts 45 installed on the right-hand edge of seat 7. In this way imperviousness of the first pressure zone is ensured.

The distribution of cooling air throughout the volume of the electrical equipment may be designed with the aid of a software program. In order to distribute the air, it is thus provided to:
- form/create a first pressure zone in fluidic communication with the air vein of the avionic bay;
- form/create a second pressure zone in fluidic communication with the said first pressure zone, the second pressure zone being enlarged in relation to the first zone so as to extend along an extension dimension greater than that of the first zone. More particularly, the second zone extends, for example, along the largest dimension of the electronic boards of the electrical equipment (beneath same) and is in fluidic communication with the interior of the electrical equipment to be cooled. The largest dimension of the equipment is that which includes the largest longitudinal dimension or length of the electronic boards.

It will be noted that the first zone extends only over a part of the largest dimension of the equipment and therefore of the length of the boards.

Fluidic communications are determined in particular by the dimensioning of porosities or apertures 34 (zone 17 of the seat) and 35 (zone 19 of base 42) with diameters and distribution different from one zone to the other.

It will be noted, however, that the diameters of apertures 34 and 35 are not necessarily different. Furthermore, the dimensioning and distribution of apertures 37 of slider support 43 determine the fluidic communication between the second zone and the interior of the equipment. It will be noted that the diameters of apertures 37 and 35 are not necessarily different.

The result of the foregoing is that the air coming from cooling air vein 14 goes through, under a pressure drop determined by the porosity of the apertures, first zone 17 of apertures 34 in order to fill first pressure chamber 39 delimited by joint 40. Then air under pressure (36) goes through a second zone 19 of apertures 35, arranged in base 42 of the housing for the equipment, and is delivered throughout the volume of second pressure chamber 41. Finally, the air is distributed (38) to volume 30 to be cooled (boards and components) in electrical equipment 2 through apertures 37 arranged in slider support 43. The preceding arrangement thus makes it possible to deliver/distribute cooling air in the entire zone 30 occupied by the electronic boards in operation.

Figure 3:
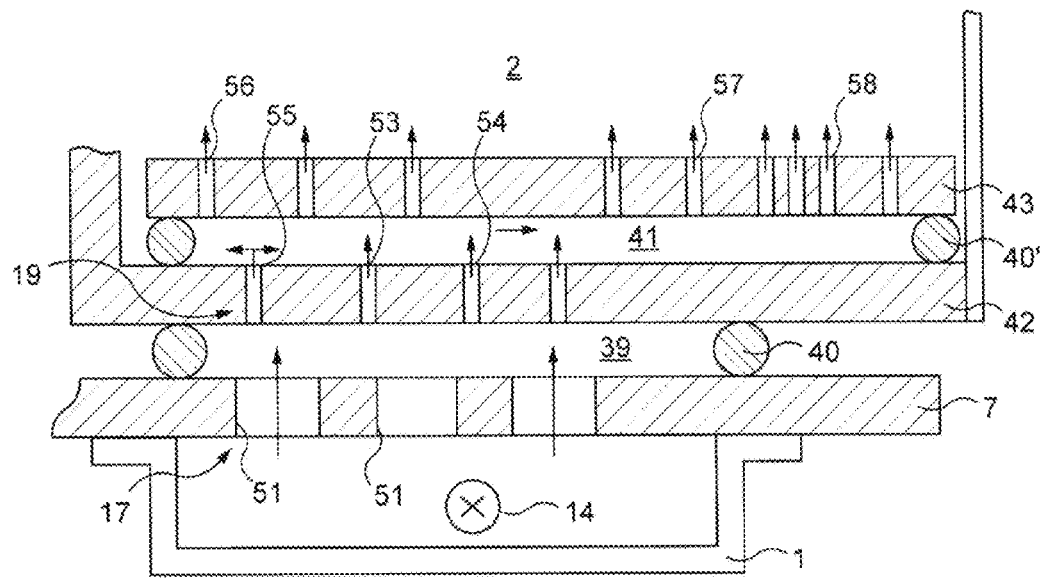
FIG. 3 shows a detail of distribution and filtration of the cooling air in the embodiment of FIG. 2.

The air filtration effect obtained by the various series or successive layers of apertures of the separation or filtration grilles now is going to be described with the aid of FIG. 3.

FIG. 3 illustrates an exemplary air distribution/filtration device according to the invention.

Rack 1 bears seat 7 of the mechanical and electrical adaptation tray which is provided with apertures 51 and constitutes a first separation/filtration grille. The distribution and number of apertures 51 is determined by the pressure drop that is wished to be imposed on gaseous vein 14 in order to pressurize first pressure chamber 39. For this purpose, the arrangement of joint 40 around perforated zones 17 and 19 is noted. Base 42 has a series of apertures 53-55 the axial (vertical) drilling axes of which are offset transversely (horizontally) in relation to the axial drilling axes of at least some apertures 51 of first grille 7. The base provided with apertures 53-55 constitutes a second separation or filtration grille. When the air under pressure goes through apertures 51 from the bottom upward, the offset of the axes of the apertures and the difference between the number of apertures in first grille 7 and in second grille 42 of apertures (it will be noted that this difference in number of apertures is optional) make it possible to break up the air jets originating from apertures 51 and to diffuse the air homogeneously to apertures 53-55 of base 42. The offset of apertures between the two grilles leads the air to follow a deviated (winding) and not straight course, forming as it were one or more baffles for the flow of air going through the first grille and getting back to the second grille to go through it. This offset arrangement ensures a protection against possible polluting particles in suspension in the air. Apertures 51 make it possible to distribute the pressure in chamber 39 in order to come to pressurize it. When an air jet originates from an aperture 51, it has a tendency to break up on the lower face of base 42, at a place disposed opposite (axially) the emerging end of aperture 51, a place where the second grille has no apertures (on the contrary, at this place the second grille has a given reserve of material). This offset arrangement makes it possible to have any polluting particles trapped in vein 14 fall down again, which particles otherwise could be introduced into the electrical equipment to be cooled. In this way, a purified and filtered air passes through apertures 53, 54, 55 of second grille 42. The same distribution of offset apertures is applied to the third series of apertures 56-58 which are distributed over the entire surface of slider support 43 (third filtration grille). This offset arrangement introduces a second step of filtration of the cooling air by creating, as between the first and second grilles, a baffle(s) effect.

As shown on FIG. 3, the air going through the apertures of second grille 42 generally follows a more winding course to get back to the apertures of third grille 43 than the air passing from the apertures of the first grille to those of the second grille. This is explained by the fact that the apertures of the third grille are distributed over a far more extensive zone than zone 19 of the second grille. Since the air flow is more markedly deviated, the filtration effect thereof is increased. The apertures of the second and third grilles are, for example, equal in size but not necessarily in number.

It will be noted that in a variant, the zone of the third series of apertures possesses the same dimensions as zone 19 of the second series of apertures.

According to another variant, the third filtration grille is omitted.

When the electronic boards are used in a damp ambient environment, polluting particles, in particular metal particles contained in the air vein and which are carried along by the forced ventilation system of the airplane, may adhere to the conductive paths of the electronic boards and constitute short-circuits of sorts between the paths of the boards. These short-circuits lead to electrical malfunctions. In order to overcome this phenomenon, some parts manufacturers put down varnish on the electronic boards so that the paths of the board are insulated from shavings possibly projected onto same. However, this involves several design disadvantages. In fact, it is necessary to perform additional varnishing operations during manufacture of the electronic boards, which is going to lead to additional costs. Furthermore, when it is wished to repair a board, it first is necessary to perform a de-varnishing operation in order to access the conductive paths. Finally, certain products used on the electronic boards are incompatible with the insulating varnishes used, for example the layers of silicone-based thermal coupling.

By filtering the largest particles at the bottom part of the electrical equipment, projection of these particles onto the boards thus is limited. To implement such a solution, a dual-baffle concept with three levels of filters is used as follows:
  a very porous lower base 42 (second filtration grille) nonetheless with closings directly facing the ventilation apertures of seat 7 (first filtration grille) of the electrical and mechanical adaptation tray; this first baffle level is intended to retain the largest particles between the bottom of rack 1 and base 42 of electrical equipment 2;
  a slider support 43 (third filtration grille) opposite lower base 42 (second grille) very clearly less porous than seat 7 of the tray so as to generate a pressure drop with apertures 56-58 still offset in relation to apertures 53-55 of lower base 42. This offset may be implemented in two ways:
  either at slider support 43,
  or through local closings on the slider support, which is porous facing the apertures of the inter-slider spaces. This second level of baffles is intended to trap the large particles which might have been able to pass the first barrier of baffles between base 42 and ARINC tray seat 7.

Figure 4:
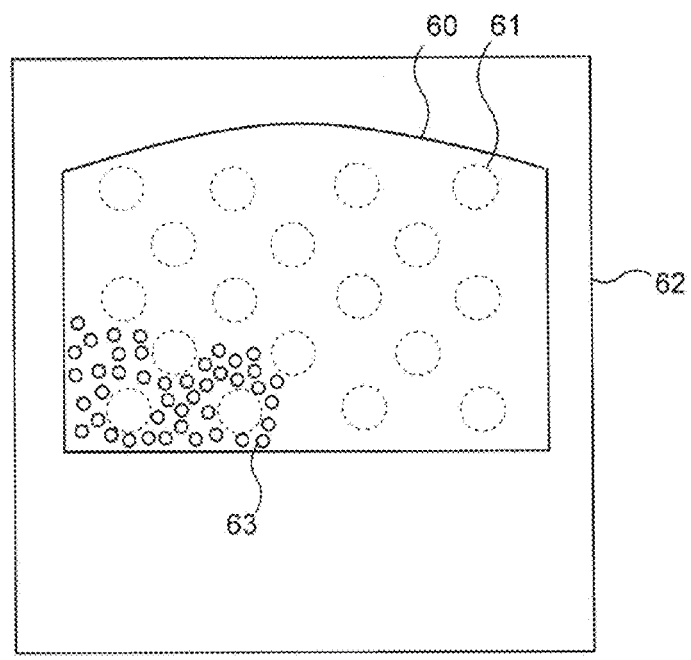
FIG. 4 shows an illustration of the first baffle level in an embodiment of the invention.

On FIG. 4, a diagram of distribution between the different porosities of the two first levels of baffles provided has been shown in a view from above. ARINC tray seat 7 is equipped with a peripheral joint 60 and with apertures 61 distributed over the entirety of first pressure zone 39 visible on FIG. 2. Above this perforated plate or grille, there is disposed the porous base of the equipment comprising a plurality of small apertures 63 which are offset in relation to any aperture 61 of the seat (apertures 61 are seen showing through in order to facilitate understanding). Apertures 63 are arranged between apertures 61 along a projection view on the seat of the tray. Porous base 62 of the equipment has apertures only in the zone surrounded by joint 60 so as to allow a communication exclusively with first pressure chamber 39.

Figure 5:
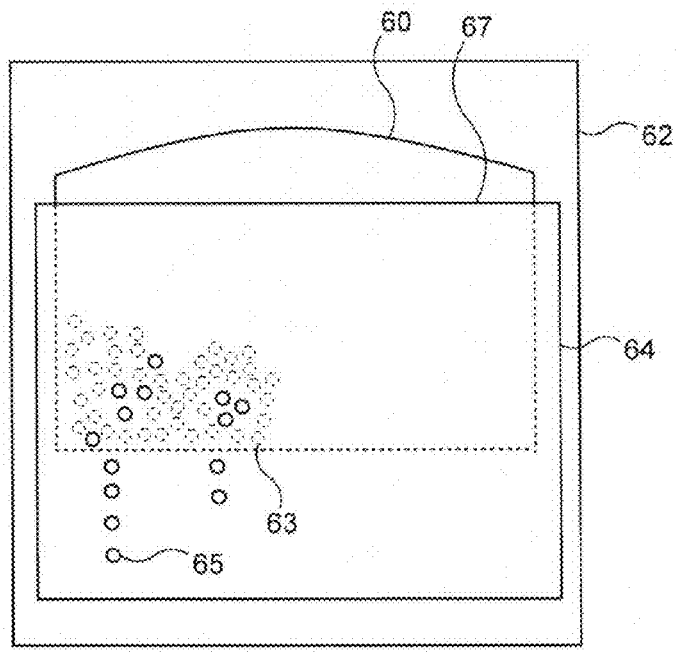
FIG. 5 shows an exemplary embodiment of a second level of baffles in another embodiment of this invention.

FIG. 5 illustrates an embodiment of two levels of baffles. Joint 60 and porous base 62 with its apertures 63 have been shown again. Slider support 64 is disposed above the second pressure chamber. Slider support 64 is provided with a series of apertures 65 contained in widened zone 67, and which are disposed above apertures 63 of base 62 of the equipment, but in offset manner. Apertures 65 also extend in a zone that is offset laterally in relation to the zone of the seat delimited by joint 6.

The result of this arrangement is that the air under pressure may pass from first pressure chamber 39 to second pressure chamber 41, thus making it possible to diffuse the air in the interior of the equipment in a zone 67 with larger expanse than delimited zone 60 available by default in the avionic bay.

Figure 6:
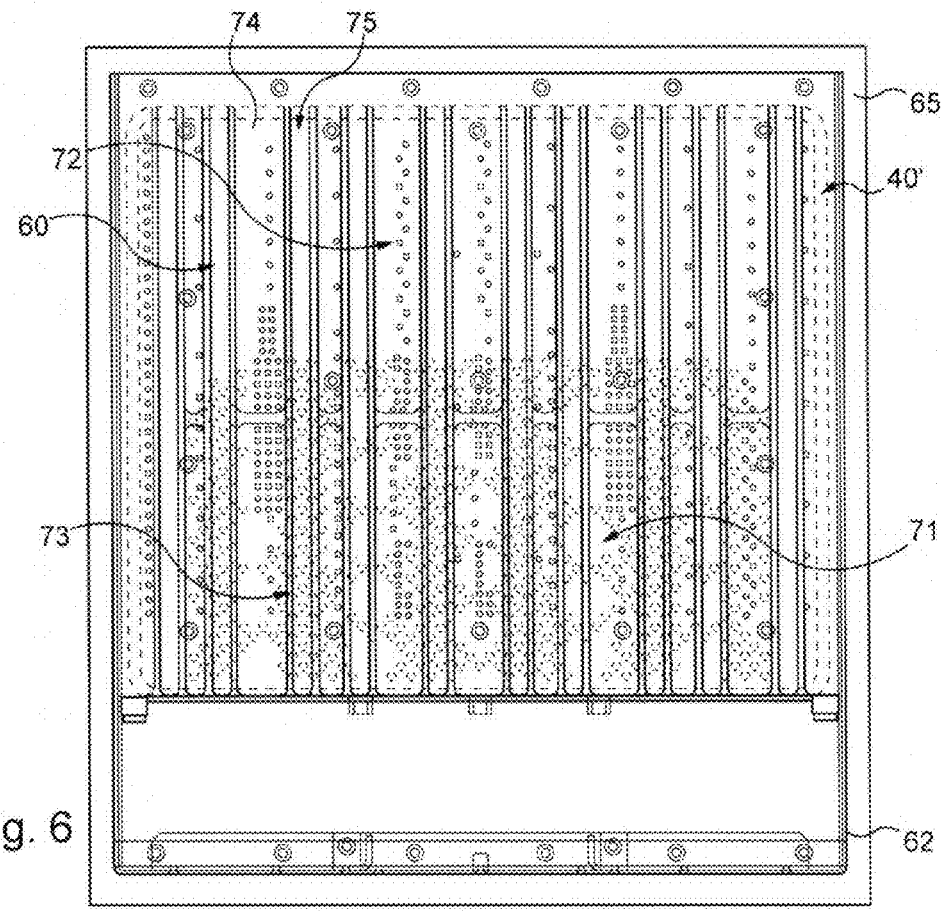
FIG. 6 shows an embodiment of the invention in an ARINC 600-type avionic bay.

On FIG. 6, an embodiment of the device of the invention has been shown schematically in a view from above. The seat (delimited zone 60) of the ARINC tray and lower porous base 62 of the equipment that serves to support the sliders for the boards thus are discerned. In this stacking, sliders 75 and perforated inter-slider zones 74 for cooling the electronic boards may be seen. Joint 40' between the base and the slider support is disposed in a maintenance groove of the base. Ventilation apertures 72 are disposed both in the inter-slider zones such as zone 74 and outside ARINC zone 60 but are not arranged facing the apertures of the porous lower base. Reserves of material 71 also have been provided on the porous lower base so that the main apertures of the seat of the ARINC tray do not directly face the apertures of the base of the equipment.

Figure 7:
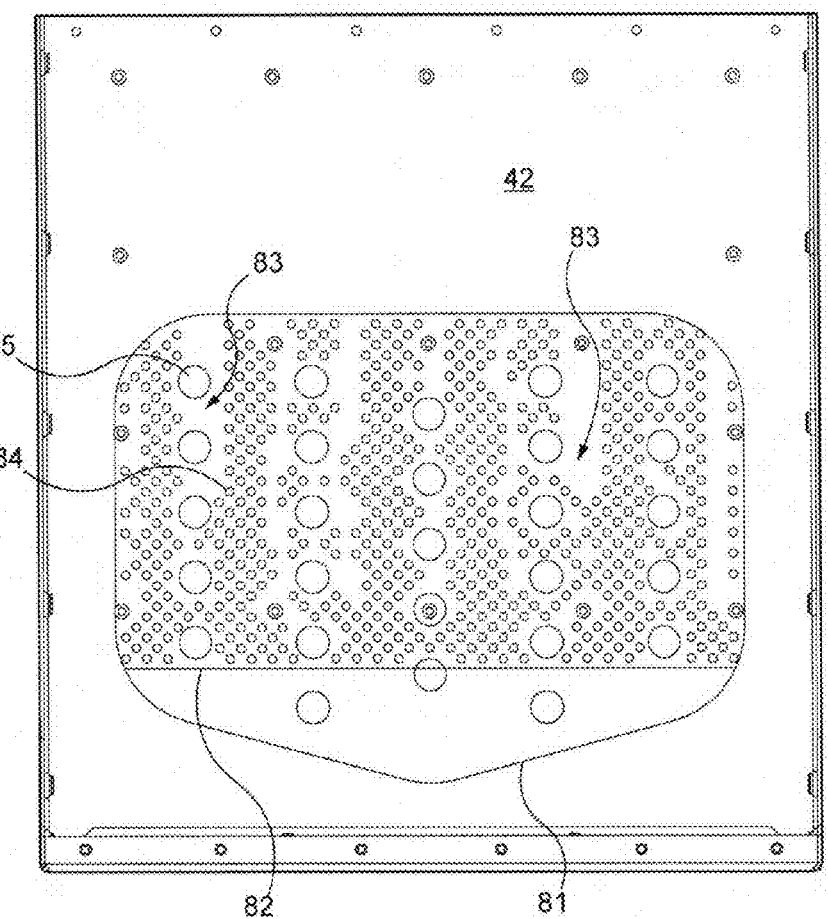
FIG. 7 shows a view from above illustrating the make-up of a part of a filtration device according to an embodiment of this invention.

FIG. 7 is a view from above of the porous lower base which is disposed above the seat of the ARINC tray. This porous lower base 42 comprises an aperture or porosity zone 82 disposed above aperture zone 81 implemented in the seat of the ARINC tray. Aperture zone 82 is delimited by the limitation joint of first pressure chamber 39 so that the apertures of zone 82 allow a controlled fluidic connection between the first and second pressure zones.

Material reserve zones 83 and apertures 84 have been shown on lower base 42. Material reserve zones 83 are situated facing ventilation apertures 85 of the tray seat. These zones 83, however, also may be placed facing the ventilation apertures of the slider-holder plate or slider support 43 (not shown on FIG. 7).

According to the invention, the taking into consideration of the constraints of pressure drop which the electrical equipment imposes results directly in a porosity, or a degree of porosity, determined for each of the three levels of separation of filtration grilles. It will be noted that the low porosity values (small diameters) of the separations or grilles may create high local speeds, potentially generating interference in the pressure-flow operating range. These interferences are uncomfortable for the crew and the passengers on board the aircraft. These acoustic phenomena are intensified when the ventilation system generates:
  high-speed air jets in the equipment,
  abrupt variations between passage areas between the electronic bay and the equipment access.

The invention offers a more gradual variation of the separations, between the ARINC tray and the porous lower base on the one hand, and between the porous lower base and the slider support on the other hand, the porosity of which then may be increased. By increasing the porosity for the same flow, air speeds may be reduced.

It will be noted that the obstacles resulting from the dual-baffle concept favorably disturb the flow of the air, thereby attenuating the acoustic phenomena of whistling and/or resonant cavity. By adjusting the various degrees of porosity and the distributions of material reserves at the time of design, it is possible to obtain:

a function of distributor of air over the lower surface of the equipment, an optimization of forced convection performance during ventilated conditions but also when the ventilation is out of order and one goes over to natural convection;

filtration of the most voluminous impurities by virtue of the concept of three porosity levels.

During ventilated conditions, gains are obtained ranging between:

0 and 10° C. temperature lowering depending on the components and the electronic boards with an average value on the order of 3° C. in ventilated conditions over average temperature rises of 15 to 25° C. This comes down to being able to evacuate an additional dissipated thermal power ranging between 12 and 20% in comparison with the state of the art.

from 0 to 5° C. temperature lowering on cutoff of ventilation, with an average value of 1 to 2° C. depending on the electronic boards and the components;

Over temperature rises of 35 to 40° C., the average gain in dissipated thermal power is 2.5 to 6% and over average temperature rises of 25° C., the average gain in dissipated thermal power is 4 to 8%.

It has been noted following tests that:

on a type-3MCU equipment item, an increase in porosity of 78% on the slider-holder plate with joint (slider support) outside the first pressure chamber is expressed simply by a flow increase between 40 and 45% over the pressure range tested;

on a type-6MCU equipment item, an increase in porosity of 42% on the slider-holder plate with joint outside the zone of the first pressure chamber is expressed simply by a flow increase of 15 to 20% over the pressure range tested.

By determining the degrees of porosity of the three grilles or separations beforehand, a more effective distribution of cooling air may be provided in normal forced convection mode as well as in degraded natural convection mode.

The invention claimed is:

1. An avionic bay comprising at least one aircraft electronic equipment item, and a device for filtration of cooling air intended to cool said at least one electronic equipment item, the device comprising:

a channel to convey a cooling air vein intended to be distributed at least in part to an aircraft electrical equipment item, a first grille positioned above the channel in an axial direction so as to filter at least one part of the cooling air vein supplied from the channel, the first grille including first apertures that go right through the grille along the axial direction, a second grille positioned above the first grille in the axial direction so as to filter said at least one part of the cooling air vein supplied from the channel and filtered beforehand by the first grille, the second grille including second apertures that are offset transversely in relation to the apertures of the first grille, a third grille positioned above the second grille in the axial direction so as to filter said at least one part of the cooling air vein supplied from the channel and filtered beforehand by the first grille and the second grille, the third grille including third apertures that are offset transversely in relation to the apertures of the second grille.

2. The avionic bay according to claim 1, wherein a passage of the air through the grilles is carried out along the axial direction.

3. The avionic bay according to claim 1, wherein the filtration grilles are disposed parallel.

4. The avionic bay according to claim 1, wherein the first and second grilles are spaced apart from one another and a space between the first and second grilles around a zone of the first and second grilles including the apertures is closed off with regard to outside.

5. The avionic bay according to claim 1, further comprising an electrical and mechanical adaptation tray, the first filtration grille forming part of the said tray and the said at least one electronic equipment item being installed on the said tray.

6. The avionic bay according to claim 5, wherein the said at least one electronic equipment item is installed on the tray through a base of which the second grille forms part.

7. The avionic bay according to claim 5, wherein the tray is installed on a rack integrating the cooling air vein.

8. An aircraft comprising at least an avionic bay according to one of claims 1 to 4 and 5 to 7.

9. The avionic bay according to claim 1, wherein the first apertures have a first diameter which is greater than a second diameter of the second apertures.

10. The avionic bay according to claim 9, wherein the second diameter of the second apertures is greater than a third diameter of the third apertures.

11. The avionic bay according to claim 1, further comprising a first joint between the first and second grilles so as to delimit a first pressure chamber.

12. The avionic bay according to claim 11, further comprising a second joint between the second and third grilles so as to delimit a second pressure chamber.

\* \* \* \* \*